United States Patent [19]

Onodera

[11] Patent Number: 5,005,105
[45] Date of Patent: Apr. 2, 1991

[54] STRESS-RELIEVING FLEXIBLE CIRCUIT BOARD HOLDER PLATE

[75] Inventor: Norio Onodera, Furukawa, Japan

[73] Assignee: Alps Electric Co., Ltd., Tokyo, Japan

[21] Appl. No.: 311,928

[22] Filed: Feb. 16, 1989

[30] Foreign Application Priority Data

May 13, 1988 [JP] Japan .......................... 63-63212[U]

[51] Int. Cl.⁵ .............................................. H05K 1/00
[52] U.S. Cl. .................................................... 361/398
[58] Field of Search ............... 361/403, 398, 406, 408, 361/409, 413, 417, 419, 420; 439/44, 74, 75, 77, 80, 81, 82, 85; 174/254, 255, 261

[56] References Cited

U.S. PATENT DOCUMENTS 4,607,147  8/1986  Ono et al.
4,623,768  11/1986  Gnant

FOREIGN PATENT DOCUMENTS 8302377  5/1984  United Kingdom ............. 339/17 F

Primary Examiner—Leo P. Picard
Assistant Examiner—Donald A. Sparks
Attorney, Agent, or Firm—Guy W. Shoup; David W. Heid

[57] ABSTRACT

A flexible print circuit board which is almost free from damages to the distributor section is provided. This circuit board comprises a wired flexible insulation film held on a holder plate, a distributor section having a portion projecting from said insulation film, a cluster of conductive patterns arranged on said distributor section, and a recessed portion provided on the holder plate under the area of the distributor section. This recess portion, which has a width greater than that of said cluster of conductive patterns, effectively accommodates bending stress.

5 Claims, 2 Drawing Sheets

STRESS-RELIEVING FLEXIBLE CIRCUIT BOARD HOLDER PLATE

BACKGROUND OF THE DISCLOSURE

The present invention relates to a flexible print circuit board and more particularly to the holder plate for holding insulation films having a distributor section that comprises a cluster of printed conductive patterns.

FIGS. 5 and 6 respectively illustrate a plan view and a sectional view of a conventional flexible print circuit board typically used for a membrane switch, a doublet or a similar item.

In these drawings, reference numeral 2 and 31 respectively denote a flexible insulation film and a holder plate which rigidly hold the insulation film 2 by means of two-sided adhesive tape or some other bonding material not shown in the drawings. Portions 2a is not bonded to the holder plate 31, but projects from the holder plate 31, and constitutes a distributor section. Reference numeral 13 denotes a cluster of printed conductive patterns made of silver, carbon or other materials which is electrically connected with the wiring provided on the insulation film 2, but not shown in the drawings. Reference numeral 14 denotes a resist layer printed on a portion of the insulation film 2. The portion of the cluster of conductive patterns not covered by the resist layer 14 and exposed to atmosphere constitutes lead section 13a to be used for connection with external terminals.

Thus, electric signals in the wiring located on the insulation film 2 are conveyed by the cluster of conductive patterns 13 and taken from the lead section 13a.

A conventional, flexible print circuit board having an arrangement as described above is accompanied by a serious drawback. There, the cluster of conductive patterns 13 can be easily broken when the distributor section 2a is pressed hard against the juxtaposed edge of the holder plate 31 because the edge acts as a fulcrum of rotation.

The problem is serious, particularly with a flexible print circuit board designed for use with an electric appliance such as a washing machine or dryer. Because these appliances operate in a wet environment, the print circuit board is often equipped with a thick resist layer 14 or a plurality of resist layers 14 in an attempt to enhance the water proof and electric insulation of the board, thereby sacrificing flexibility. Hence, the board is very rigid.

When the distributor section 2a of such a flexible print circuit board is pressed against the corresponding edge of the holder plate 31 and bent, the resist layer 14, having a relatively poor flexibility, cannot follow the turning movement of the more flexible insulation film 2 and eventually comes off the latter. Then, part of the cluster of conductive patterns 13 may also be pulled off by the resist layer 14, thereby breaking some of the patterns.

Therefore, an object of the present design is to eliminate the above described drawback of the conventional technology by providing a flexible print circuit board which is highly resistant against bending deformations at the edge of the holder plate.

SUMMARY OF THE DISCLOSURE

The above object is achieved by providing a flexible print circuit board comprising a wired flexible insulation film held on a holder plate, a distributor section having a portion projecting from the holder plate, and a cluster of conductive patterns arranged on said distributor section. The holder plate is provided with a recessed portion under the distributor section. This recessed portion has a width greater than that of the cluster of conductive patterns.

With a print circuit board according to the present invention, the risk of breakage of the cluster of conductive patterns is considerably reduced. When the distributor section 2a of the insulation film is bent at the corresponding edge of the holder plate, the bending stress is accommodated by both sides of the recess of the holder plate. When a resist layer is provided on the insulation film to cover the cluster of conductive patterns, the latter will not easily come off the insulation film because the bending radius R of the resist layer is relatively large.

The present invention will be described in greater detail by referring to the accompanying drawings which illustrate embodiments of the invention.

DETAILED DESCRIPTION OF THE DISCLOSURE

Figure 1:
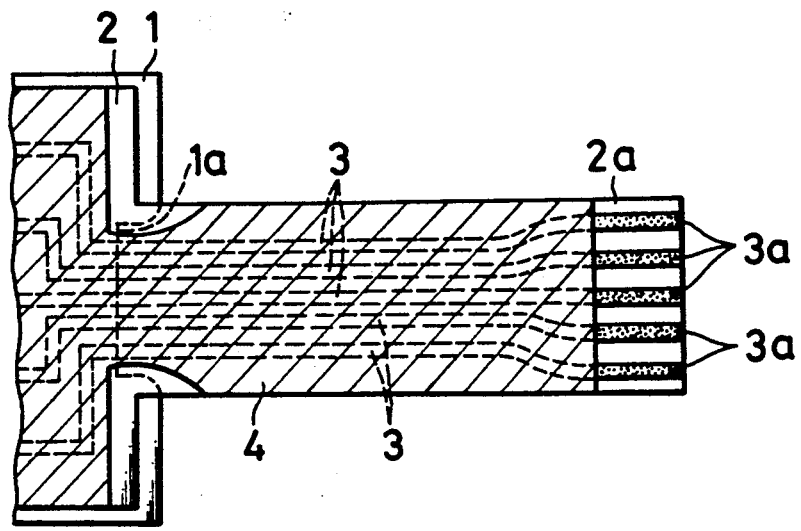
FIG. 1 is a plan view of a first embodiment of the flexible print circuit board according to the present invention.
Figure 5:
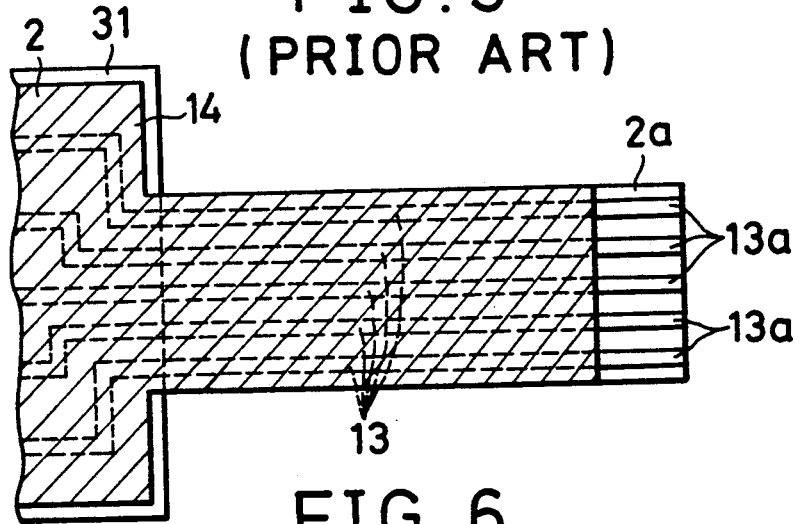
FIG. 5 is a plan view illustrating a conventional flexible print circuit board.
Figure 6:
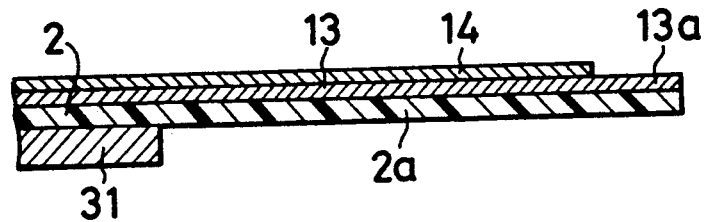
FIG. 6 is a sectional view of the print circuit board of FIG. 5.

Now, referring to the first embodiment of the present invention as illustrated in FIG. 1, the components which are similar to those of the conventional board as illustrated in FIGS. 5 and 6 are indicated by identical reference symbols and will not be described further.

This first embodiment differs from the above described conventional flexible print circuit board in that a recessed portion 1a in the form of a notch is provided on the holder plate 1. The corners of the recessed portion 1a are rounded. The holder plate is made of a metal such as iron or aluminum, or synthetic resin, such as phenol resin or epoxy resin. The flexible insulation film 2 is made of polyester or other synthetic materials. The width of the recessed portion 1a is greater than that of the cluster of conductive patterns 3 printed on the distributor section 2a and that of the resist layer 4 printed on the insulation film, with the exception of the lead section 3a.

Now, if the distributor section 2a, as described above, is bent around the edge of the holder plate, the bending stess is accommodated by both sides of the distributor section 2a or the area that divides the cluster of conductive patterns 3 and the resist layer 4. Hence, the cluster of conductive patterns 3 is not pressed hard against the edge of the holder plate 1. Moreover, the bending radius R of the resist layer 4 is larger than that of a conventional distribution board having no recessed portion.

This larger bending radius further reduces the risk of breakage of the cluster of conductive patterns 3.

Figure 2:
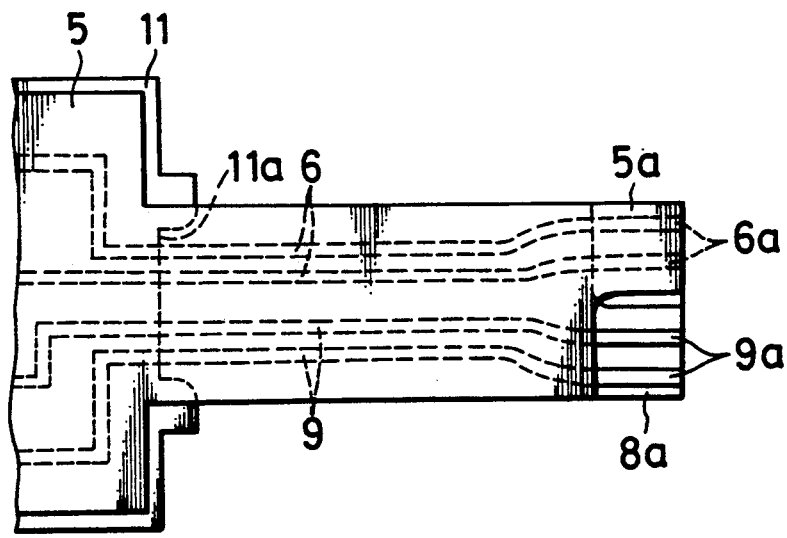
FIG. 2 is a plan view of a second embodiment where the flexible print circuit board is used for a membrane switch.
Figure 3:
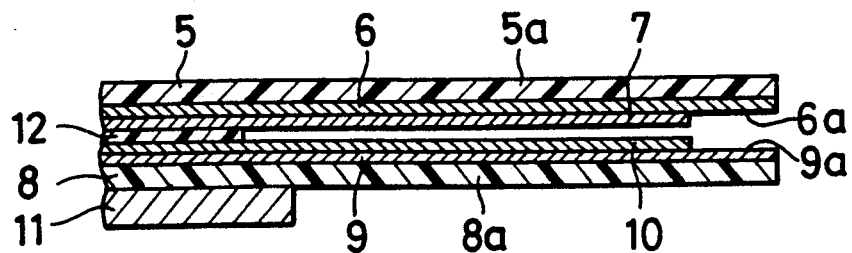
FIG. 3 is a sectional view of the embodiment of FIG. 2.

FIGS. 2 and 3 illustrate a second embodiment of the present invention where the print circuit board is used for a membrane switch. Of the drawings, FIG. 2 is a plan view and FIG. 3 is a sectional view of the embodiment.

In this embodiment, a first flexible insulation film 5, a spacer 12 having a through bore not shown, and a second flexible insulation film 8 are provided on the holder plate 11 having a recessed portion 11a. The above-mentioned layers are bonded together by means of two-sided adhesive tape which is not shown. The lower surface of the first insulation film 5 and the upper surface of the second insulation film 8 respectively carry an upper contact point and a lower contact point which are not shown in the drawings, but are located opposite each other within the through bore of the spacer 12. Thus, the membrane switch is constituted by the first insulation film 5, the spacer 12, and the second insulation film 8. Distributor sections 5a and 8a are respectively projecting from the first and second insulation films 5 and 8. The first and second clusters of conductive patterns 6 and 9, made of iron or carbon, are respectively formed on the lower surface of the distributor section 5a and the upper surface of the distributor section 8a. The first cluster of conductive patterns 6 and the second cluster of conductive patterns 9 are electrically connected with the upper and lower contact points respectively. Resist layers 7 and 10 are respectively formed by printing on a portion of the lower surface of the first insulation film 5 and a portion of the upper surface of the second insulation film 8. The exposed portion of the first cluster of conductive patterns 6 which is not covered by the resist layer 7, and that of the second cluster of conductive patterns 9 which is not covered by the resist layer 10, respectively form the lead sections 6a and 9a for electric connection with external terminals.

In this second embodiment, the recessed portion 11a is located on a projection of the holder plate. The width of the recessed portion is greater than that of the portion of the first cluster of conductive patterns 6, the second cluster of conductive patterns 9, or the resist layer 7 or 10 located on the recessed portions 11a. The recessed portion 11a is smaller than the distributor section 5a of the first insulation film 5 and the distributor section 8a of the second insulation film 8. The corners of the recessed portion 11a are rounded.

A membrane switch having a configuration as described above is also relatively free from breakage of the clusters of conductive patterns 6 and 9 when the distributor section 5a of the insulation film is bent around the corresponding edge of the holder plate.

Figure 4:
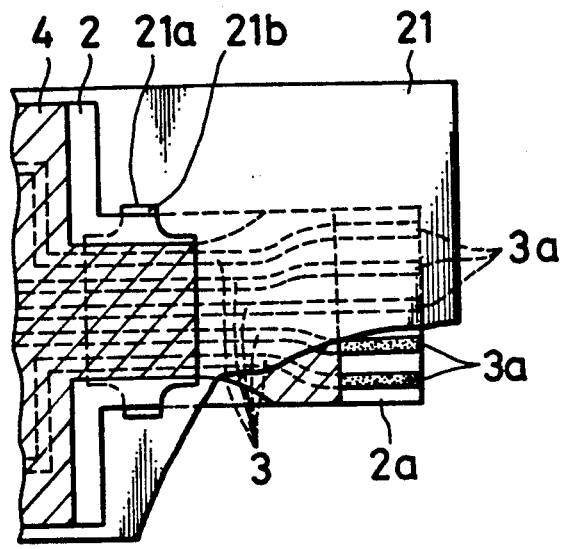
FIG. 4 is a third embodiment of the flexible print circuit board according to the present invention.

FIG. 4 shows a plan view of a third embodiment of the present invention. The components which are similar to those in FIG. 1 are indicated by identical reference symbols and will not be described further.

This third embodiment differs from the first in that the recessed portion of the holder plate 2 is not a notch, but a slit 21a formed in the holder plate 21 in which the distributor section 2a of the insulation film 2 is accommodated. In other words, the width of the slit 21a of the holder plate 21 is larger than that of the distributor section 2a and the later projects through the former. The width of the slit 21a is greater than that of the cluster of conductive patterns 3 which are made of silver or carbon and formed by printing on the distributor section 2a of the insulation film 2. The width of slit 21a is also greater than that of the portion of the resist layer 4 printed on the insulation film with the exception of the area of the lead section 3a of the cluster of conductive patterns, but smaller than the width of the distributor section 2a of the insulation film 2. The corners of said recessed portion 21a are rounded.

This embodiment is relatively free from breakage of the distributor section 2a of the insulation film when bent around the corresponding edge of the bore 21b of the holder plate 21, and also does not result in separation of the insulation film 2 from the holder plate 21 which are bonded together by two-sided adhesive tape.

While each of the above embodiments is provided with a recessed portion having rounded corners, the present invention is not limited to such a design concept, but includes all possible configurations of a recessed portion without rounded corners, provided that the width of the recessed portion is greater than that of the cluster of conductive patterns and that of the resist layer formed thereon.

While the above embodiments comprise one or two flexible insulation films in a flexible print circuit board, more than two insulation films formed in layers can be provided without departing from the scope of the present invention.

What is claimed is:

1. A flexible print circuit board comprising a wired flexible insulation film held on a holder plate, a distributor section having a portion projecting from said insulation film, said distributor section including a cluster of conductive patterns arranged on said insulation film, wherein said holder plate is provided with a recessed portion under said distributor section, said recessed portion having a width greater than that of said cluster of conductive patterns.

2. A flexible print circuit board according to claim 1, wherein said recessed portion of the holder plate is provided with rounded and beveled corners for absorbing bending stress.

3. A flexible print circuit board according to claim 1, further including a resist layer covering a portion of said conductive patterns, wherein said recessed portion of the holder plate is a notch having a width greater than the width of the portion of said resist layer formed on the projection of said insulation film and smaller than that of the projection of the insulation film.

4. A flexible print circuit board according to claim 1, wherein said holder plate includes a projection extending from an edge of said holder plate and said recessed portion of the holder plate is formed in said projection.

5. A flexible print circuit board according to claim 1, wherein said recessed portion is formed on the periphery of a through bore provided on the holder plate to accommodate the distributor section of the insulation film.

* * * * *